United States Patent
Yamaguchi et al.

(10) Patent No.: US 6,735,538 B1
(45) Date of Patent: May 11, 2004

(54) APPARATUS AND METHOD FOR MEASURING QUALITY MEASURE OF PHASE NOISE WAVEFORM

(75) Inventors: Takahiro Yamaguchi, Tokyo (JP); Masahiro Ishida, Tokyo (JP); Mani Soma, 12043 11th Ave. NW., Seattle, WA (US) 98177-4611

(73) Assignees: Advantest Corporation, Tokyo (JP); Mani Soma, Seattle, WA (US)

( * ) Notice: Subject to any disclaimer, the term of this patent is extended or adjusted under 35 U.S.C. 154(b) by 0 days.

(21) Appl. No.: 09/538,186

(22) Filed: Mar. 29, 2000

(51) Int. Cl.[7] ............................................. G01R 29/26
(52) U.S. Cl. .......................... 702/69; 702/66; 702/72; 702/79; 702/189; 702/375; 702/226
(58) Field of Search ............................ 702/66, 79, 111, 702/117, 106, 124–126, 183, 189, 191, 193, 195, 69, 72, 81; 375/226, 227; 324/613, 614; 381/317, 318

(56) References Cited

U.S. PATENT DOCUMENTS

| | | | | |
|---|---|---|---|---|
| 3,743,932 A | * | 7/1973 | Newman et al. | 324/140 D |
| 3,814,868 A | * | 6/1974 | Bradley | 379/29.01 |
| 4,091,331 A | * | 5/1978 | Kaser et al. | 375/362 |
| 4,654,861 A | * | 3/1987 | Godard | 375/226 |
| 4,835,790 A | * | 5/1989 | Yoshida et al. | 375/10 |
| 5,749,068 A | * | 5/1998 | Suzuki | 704/233 |
| 6,104,983 A | * | 8/2000 | Nakada | 702/66 |
| 6,167,359 A | * | 12/2000 | Demir et al. | 702/191 |
| 6,185,510 B1 | * | 2/2001 | Inoue | 702/69 |
| 6,229,847 B1 | * | 5/2001 | Schlosser | 375/227 |
| 6,239,834 B1 | * | 5/2001 | Miyaji et al. | 348/193 |
| 6,240,130 B1 | * | 5/2001 | Burns et al. | 375/226 |
| 6,259,389 B1 | * | 7/2001 | McGrath | 341/120 |
| 6,295,315 B1 | * | 9/2001 | Frisch et al. | 375/226 |
| 6,330,431 B1 | * | 12/2001 | Rostamy et al. | 455/226.1 |
| 6,356,850 B1 | * | 3/2002 | Wilstrup et al. | 702/69 |

OTHER PUBLICATIONS

Cosart et al., "Time Domain Analysis and Its Practical Application to the Measurement of Phase Noise and Jitter". IEEE Transactions on Instrumentation and Measurement vol. 46, No. 4. Aug. 1997.*
Wolfram Research, "Correlation Coefficient". 1999.*
Narasimhamurthi, N. et al. "Estimating the Parameters of a Sinusoid Sampled by a Clock with Accumulated Jitter", IEEE Sensing, Processing, Networking, vol. 2, 1997.*
Sugar, Gary et al. "Convergence Properties of Optimal Adaptive Carrier Phase Jitter Predictors for Sinusoidal Jitter", IEEE Transactions on Communications, vol. 43, 1995.*
Privalov, Aleksandr et al. "Per–Stream Jitter Analysis in CBR ATM Multiplexors", IEEE Transactions on Networking, vol. 6, 1998.*
Uchiyama, Kentaro et al. "Signal–to–Noise Ratio Analysis of 100 Gb/s Demultiplexing Using Nonlinear Optical Loop Mirror", Journal of Lightwave Technology, vol. 15, 1997.*

* cited by examiner

*Primary Examiner*—Marc S. Hoff
*Assistant Examiner*—Jeffrey R West
(74) *Attorney, Agent, or Firm*—David N. Lathrop, Esq.; Gallagher & Lathrop

(57) ABSTRACT

A clock signal $x_c(t)$ that has been converted into a digital signal is transformed into a complex analytic signal $z_c(t)$, and an instantaneous phase $\Theta$ of the $z_c(t)$ is estimated. A linear phase is removed from the $\Theta$ to obtain a phase noise waveform $\Delta\phi(t)$. The $\Delta\phi(t)$ is sampled at a timing close to a zero crossing timing of the $x_c(t)$ to extract the $\Delta\phi(t)$ sample. A root-mean-square value $\sigma_t$ of the $\Delta\phi(t)$ samples is obtained, and a differential waveform of the extracted $\Delta\phi(t)$ samples is also obtained to obtain a period jitter $J_p$. Then a root-mean-square value $\sigma_p$ of the $J_p$ is obtained to calculate a correlation coefficient $\rho_{tt}=1-(\sigma_p^2/(2\sigma_t^2))$. If necessary, an $SNR_t=\rho_{tt}^2/(1-\rho_{tt}^2)$ is obtained. The $\rho_{tt}$ and/or the $SNR_t$ is defined as a quality measure of a clock signal.

23 Claims, 8 Drawing Sheets

| Operating mode | $\frac{\sigma_p}{T}$ | SNRt | $\rho_{tt}$ |
|---|---|---|---|
| Quiet | 0.003741 | 6.936 dB | 0.9119 |
| Noisy | 0.006274 | 4.610 dB | 0.8619 |
| Difference | 4.49 dBR | 2.330 dBR | — |

APPARATUS AND METHOD FOR MEASURING QUALITY MEASURE OF PHASE NOISE WAVEFORM

BACKGROUND OF THE INVENTION

The present invention relates to an apparatus and a method for measuring a quality measure of a clock signal that drives, for example, a microprocessor.

A jitter has traditionally been used as a measure for estimating quality of a clock signal of a microprocessor. Incidentally, there are two types of jitters, i.e., a period jitter and a timing jitter. As shown in FIG. 1A, in a jitter-free ideal clock signal, for example, an interval $T_{int}$ between adjacent rising points is constant as indicated by a dotted line waveform, and in this case a period jitter is zero. In an actual clock signal, a rising edge fluctuates from an arrow toward leading side or trailing side, i.e., an interval $T_{int}$ between adjacent rising points fluctuates, and this fluctuation of the interval is a period jitter. For example, in the case of a sine wave that does not have a rectangular waveform like a clock signal, a fluctuation of an interval $T_{int}$ between zero crossing points is also a period jitter.

As shown in FIG. 1B, when a jitter-free square waveform is assumed to be a dashed line waveform, a deviation width $\Delta\phi$ of an actual rising point (solid line) from a normal rising point (dashed line) is a timing jitter in the case of a jittery square waveform.

A conventional measurement of a period jitter is performed by a time interval analyzer (hereinafter, this measuring method is referred to as a time interval method or a TIA method). This is shown in "Phase Digitizing Sharpens Timing Measurements", by David Chu, IEEE Spectrum, pp. 28–32, 1988, and "Time Domain Analysis and Its Practical Application to the Measurement of Phase Noise and Jitter", by Lee D. Cosart et al., IEEE Trans. Instrum. Meas., vol. 46, pp. 1016–1019, 1997. This time interval method is a method in which zero crossing points of a signal under test are counted, an elapsed time is measured, and a time fluctuation between zero crossing points is obtained to obtain a period jitter. In addition, a root-mean-square value of the period jitters is obtained.

There is a method, as a conventional timing jitter measurement, in which a timing jitter is measured by measuring a phase noise-spectrum in frequency domain, and those spectrums are summed to estimate a root-mean-square value of timing jitters.

The inventors of the present invention have proposed a method of measuring a jitter as described below in an article entitled "An Application of An Instantaneous Phase Estimating Method to A Jitter Measurement" in a technical report "Probo" pp. 9–16 issued by Probo Editorial Room of ADVANTEST CORPORATION, Nov. 12, 1999. That is, as shown in FIG. 2, an analog clock waveform from a PLL circuit under test (Phase locked loop) 11 is converted into a digital clock signal $x_c(t)$ by an analog-digital converter 12, and the digital clock signal $x_c(t)$ is supplied to a Hilbert pair generator 14 acting as analytic signal transforming means 13, where the digital clock signal $x_c(t)$ is transformed into an analytic signal $z_c(t)$.

Now, a clock signal $x_c(t)$ is defined as follows.

$$x_c(t) = A_c \cos(2\pi f_c t + \theta_c + \Delta\phi(t))$$

The $A_c$ and the $f_c$ are nominal values of amplitude and frequency of the clock signal respectively, the $\theta_c$ is an initial phase angle, and the $\Delta\phi(t)$ is a phase fluctuation that is called a phase noise.

The clock signal $x_c(t)$ is Hilbert-transformed by a Hilbert transformer 15 in the Hilbert pair generator 14 to obtain the following equation.

$$\hat{x}_c(t) = H[x_c(t)] = A_c \sin(2\pi f_c t + \theta_c + \Delta\phi(t))$$

Then, an analytic signal $z_c(t)$ having $x_c(t)$ and $\hat{x}_c(t)$ as a real part and an imaginary part, respectively is obtained as follows.

$$\begin{aligned} z_c(t) &= x_c(t) + \hat{x}_c(t) \\ &= A_c\cos(2\pi f_c t + \theta_c + \Delta\phi(t)) + jA_c\sin(2\pi f_c t + \theta_c + \Delta\phi(t)) \end{aligned}$$

From this analytic signal $z_c(t)$, an instantaneous phase $\Theta(t)$ of the clock signal $x_c(t)$ can be estimated by the instantaneous phase estimator 16 as follows.

$$\Theta(T) = [2\pi f_c t + \theta_c + \Delta\phi(t)] \bmod 2\pi$$

A linear phase is removed from this instantaneous phase $\Theta(t)$ by a linear phase remover 17 to obtain a phase noise waveform $\Delta\phi(t)$. That is, in the linear phase remover 17, a continuous phase converting part 18 applies a phase unwrap method to the instantaneous phase $\Theta(t)$ to obtain a continuous phase $\theta(t)$ as follows.

$$\theta(t) = 2\pi f_c t + \theta_c + \Delta\phi(t)$$

The phase unwrap method is shown in "A New Phase Unwrapping Algorithm" by Jose M. Tribolet, IEEE Trans. Acoust., Speech, Signal Processing, vol. ASSP-25, pp. 170–177, 1977 and in "On Frequency-Domain and Time-Domain Phase Unwrapping" by Kuno P. Zimmermann, Proc. IEEE. vol. 75, pp. 519–520, 1987.

A linear phase $[2\pi f_c t + \theta_c]$ of a continuous phase $\theta(t)$ is estimated by a linear phase evaluator 19 using a linear trend estimating method. This estimated linear phase $[2\pi f_c t + \theta_c]$ is subtracted from the continuous phase $\theta(t)$ by a subtractor 21 to obtain a variable term $\Delta\phi(t)$ of the instantaneous phase $\Theta(t)$, i.e., phase noise waveform as follows.

$$\theta(t) = \Delta\phi(t)$$

The phase noise waveform $\Delta\phi(t)$ thus obtained is inputted to a peak-to-peak detector 22, where a difference between the maximum peak value max $(\Delta\phi(k))$ and the minimum peak value min $(\Delta\phi(1))$ of the $\Delta\phi(t)$ is calculated to obtain a peak value $\Delta\phi_{PP}$ of timing jitters as follows.

$$\Delta\phi_{PP} = \max_k (\Delta\phi(k)) - \min_l (\Delta\phi(1))$$

In addition, the phase noise waveform $\Delta\phi(t)$ is inputted to a root-mean-square detector 23, where a root-mean-square value of the phase noise waveform $\Delta\phi(t)$ is calculated using following equation to obtain a root-mean-square value $\Delta\phi_{RMS}$ of timing jitters.

$$\Delta\phi_{RMS} = \sqrt{\frac{1}{N}\sum_{k=0}^{N-1}\Delta\phi^2(k)}$$

A method for obtaining, in this manner, a peak value of timing jitters and/or a root-mean-square value of timing jitters from the phase noise waveform $\Delta\phi(t)$ is called a $\Delta\phi$ method. According to the $\Delta\phi$ method, a jitter measurement can be performed in a test time of 100 millisecond order since measuring points are not limited to zero crossing points. Further, in FIG. 2, the analytic signal transforming means 13, the instantaneous phase estimator 16 and the linear phase remover 17 compose phase noise detecting means 25.

In the case of a jitter that each rising edge of a clock signal fluctuates in the same direction with substantially same quantity, a microprocessor driven by this clock signal is not influenced so much by the jitter. In a design of a PLL circuit that generates a clock signal, a correlation coefficient between rising edges of the clock signal is important. The correlation coefficient takes a vale of −1 to +1. If, for example, this value is 0.6, it can be seen that the PLL circuit has room for improvement in correlation coefficient by 0.4. It can be deemed that a fluctuation between adjacent rising edges of a clock signal consists of a linear fluctuation (signal) in which a fluctuation of a following rising edge depends on a fluctuation of an immediately leading rising edge and a fluctuation (noise) in which a fluctuation of a following rising edge does not relate to a fluctuation of an immediately leading rising edge, whereby a signal to noise ratio of a fluctuation of a rising edge can be defined. Such a correlation coefficient or a signal to noise ratio can clarify more correctly than a root-mean-square value of period jitters or a root-mean-square value of timing jitters can as to whether or not, for example, a PLL circuit operates in the performance close to its theoretical limit. In addition, if such a correlation coefficient or a signal to noise ratio can be measured, those are effective for a test of a PLL circuit or the like. However, a method for measuring such a correlation coefficient or a signal to noise ratio between zero crossings of a signal, namely a quality measure of a phase noise waveform has not been proposed up to today.

It is an object of the present invention to provide an apparatus and a method that can measure a quality measure of a phase noise waveform.

SUMMARY OF THE INVENTION

According to a method of the present invention, an input signal is transformed into a complex analytic signal, and an instantaneous phase of the analytic signal is obtained. A linear phase is removed from the instantaneous phase to obtain a phase noise waveform, and a correlation coefficient and/or a signal to noise ratio of the phase noise waveform, i.e., a quality measure of the phase noise waveform is obtained from the phase noise waveform. That is, according to the present invention, a quality measure is obtained by the aforementioned Δϕ method.

A signal to noise ration is obtained from the correlation coefficient. There will be explained below a principle for obtaining a correlation coefficient, and also for obtaining a signal to noise ratio from the correlation coefficient.

A correlation coefficient $\rho_{tt}(T)$ between adjacent zero crossing points nT and (n+1)T of an instantaneous timing jitter $\{\Delta\phi(nT)\}$ (T is a period of a clock signal) is obtained as follows.

A period jitter $J_p$ is obtained from a difference between two timing jitters $\Delta\phi(nT)$ and $\Delta\phi((n+1)T)$ of an input signal each being spaced apart from one another by a period T. A variance $\sigma_p^2(T)$ of this period jitter $J_p$ is obtained by the following equation as an expected value of the period jitter $J_p$.

$$\sigma_p^2(T) = E(\{\Delta\phi((n+1)T) - \Delta\phi(T)\}^2)$$
$$= E(\{\Delta\phi((n+1)T)\}^2) - 2E(\Delta\phi((n+1)T)\Delta\phi(T)) + E(\{\Delta\phi(T)\}^2)$$
$$= \sigma_t^2 - 2\frac{E(\Delta\phi((n+1)T)\Delta\phi(T))}{\sigma_t\sigma_t}\sigma_t\sigma_t + \sigma_t^2$$

In this case, $\sigma_t^2$ is a variance of timing jitter $\Delta\phi(T)$.

From equations (7–6) and (7–8) in page 150 of "Probability, Random Variables, and Stochastic Processes" by A. Papoulis, 2nd Edition, McGraw-Hill Book Company, and from a fact that each of $\Delta\phi(nT)$ and $\Delta\phi((n+1)T)$ is a deviation from an average value, $$\frac{E(\Delta\phi((n+1)T)\Delta\phi(T))}{\sigma_t\sigma_t}$$

is a correlation coefficient $\rho_{tt}$ between $\Delta\phi(nT)$ and $\Delta\phi((n+1)T)$. Therefore, the following equation is obtained.

$$\sigma_p^2(T) = 2(1 - \rho_{tt}(T))\sigma_t^2(T) \quad (1)$$

This can be re-written as follows.

$$\rho_{tt}(T) = 1 - \frac{\sigma_p^2(T)}{2\sigma_t^2(T)} \quad (2)$$

In the above equation, $\sigma_p(T)$ is a root-mean-square value of period jitters $J_p$, and $\sigma_t(T)$ is a root-mean-square value of timing jitters $\Delta\phi(T)$.

Alternatively, a correlation coefficient $\sigma_{tt}(T)$ can be obtained, from the definition of a correlation coefficient, by the following equation using a timing jitter $\{\Delta\phi(nT)\}$.

$$\rho_{tt}(T) = \frac{\sigma_{tt}}{\sigma_t\sigma_t} = \frac{\sum_i \{\Delta\phi(iT) - \Delta\phi'\}\{\Delta\phi((i+1)T) - \Delta\phi'\}}{\sum_i (\Delta\phi(iT) - \Delta\phi')^2} \quad (3)$$

$$= \frac{\sum_i \Delta\phi(iT)\Delta\phi((i+1)T) - \Delta\phi'^2}{\sum_i (\Delta\phi(iT) - \Delta\phi')^2} \quad (4)$$

In the above equation, $\Delta\phi'$ is an average value of the $\Delta\phi(nT)$.

Further, since $\Delta\phi(iT)$ itself is a deviation from the linearity according to the definition of a timing jitter, $\Delta\phi'$ is zero and hence this may be omitted from the equations (3) and (4). In addition, since $\Delta\phi'/\sigma_t$ is a small value such as $\Delta\phi'/\sigma_t = 5/1000$ from an experiment, $\Delta\phi'$ may be omitted from the equations (3) and (4).

A timing jitter variance $\sigma_{tt}^2$ of $\Delta\phi((n+1)T)$ that fluctuates against a timing jitter $\Delta\phi(nT)$ based on only a linear relationship with its fluctuation can be expressed by the following equation.

$$\sigma_{tt}^2 = \rho_{tt}^2 \sigma_{t(n+1)}^2 \quad (5)$$

A timing jitter variance $\sigma_{t,n}^2$ of $\Delta\phi((n+1)T)$ that fluctuates against a timing jitter $\Delta\phi(nT)$ based on other noises including a nonlinear relationship with its fluctuation can be expressed by the following equation.

$$\sigma_{t,n} = (1 - \rho_{tt}^2)\sigma_{t(n+1)}^2 \quad (6)$$

The equations (5) and (6) are shown in equations (3.10) and (3.11) in page 43–47 of "Engineering Applications of Correlation and Spectral Analysis" by J. S. Bendat & A. G. Piersol, John Wiley & Sons, 1980.

From the equations (5) and (6), a ratio of a linear fluctuation (signal component) of a timing jitter {Δφ((n+1)T)} based on a fluctuation of Δφ(nT) to a fluctuation (noise) not related to a fluctuation of the Δφ(nT), i.e., a noise to signal ratio $SNR_t$ can be obtained by the following equation.

$$SNR_t = \frac{\sigma_{t,t}^2}{\sigma_{t,n}^2} = \frac{\rho_{tt}^2}{1-\rho_{tt}^2} \quad (7)$$

Incidentally, if a timing jitter variance $\sigma_t$ is large, $1/SNR_t$ is also large, and if a timing jitter variance $\sigma_t$ is small, $1/SNR_t$ is also small. That is, $\sigma_t$ is proportional to $1/SNR_t$. Therefore, if $\sigma_t^2$ in the right side of the equation (1) is multiplied by $1/SNR_t$ as a proportional coefficient, and the both sides are extracted and then the both sides are divided by T, the following equations can be obtained.

$$\frac{\sigma_p}{T} \propto \sqrt{2(1-\rho_{tt})} \cdot \frac{\sqrt{\frac{\sigma_t^2}{SNR_t}}}{T} \quad (8)$$

As mentioned above, by obtaining a period jitter variance $\sigma_p$ and a timing jitter variance $\sigma_t$, a correlation coefficient $\rho_{tt}$ of a timing jitter, i.e., a phase noise waveform Δφ(t) can be obtained. In addition, a correlation coefficient $\rho_{tt}$ can be obtained from the equations (3) and (4) using a timing jitter Δφ(nT). Furthermore, a signal to noise ratio $SNr_t$ of a phase noise waveform Δφ(t) can be obtained from the equation (7) using the correlation coefficient $\rho_{tt}$.

In the present invention, a quality measure such as a correlation coefficient $\rho_{tt}$ or a signal to noise ratio $SNR_t$ is obtained by such a method using the Δφ(t).

DETAILED DESCRIPTION OF THE PREFERRED EMBODIMENTS

Figure 1A:
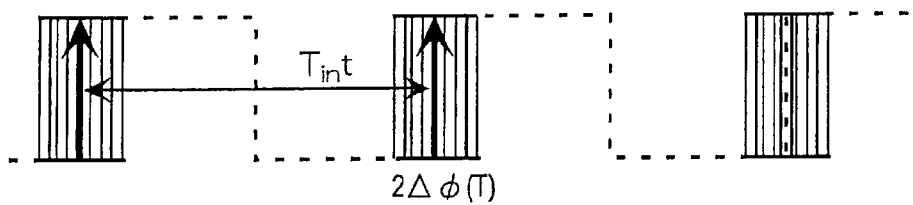
FIG. 1A is a diagram for explaining a period jitter.
Figure 1B:
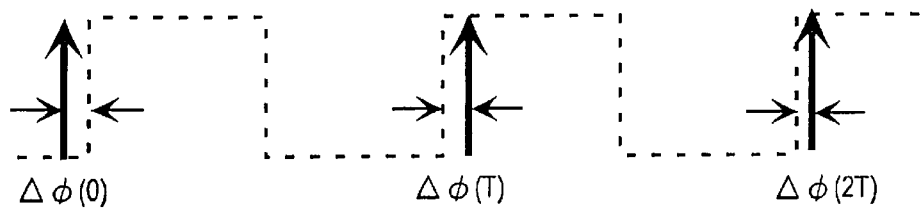
FIG. 1B is a diagram for explaining a timing jitter.
Figure 2:
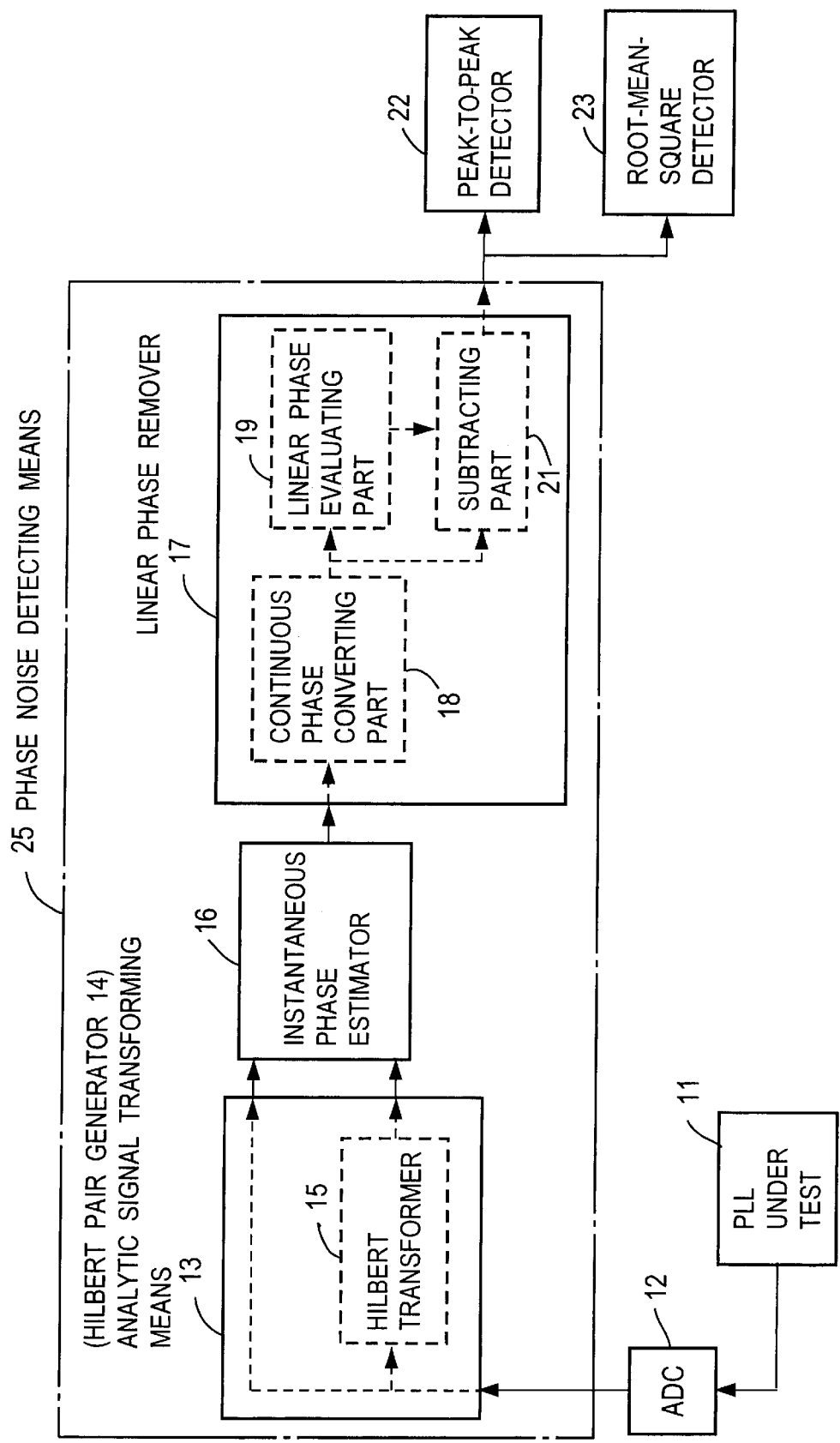
FIG. 2 is a block diagram showing a functional configuration of an apparatus for measuring a jitter based on the proposed Δφ method.
Figure 3:
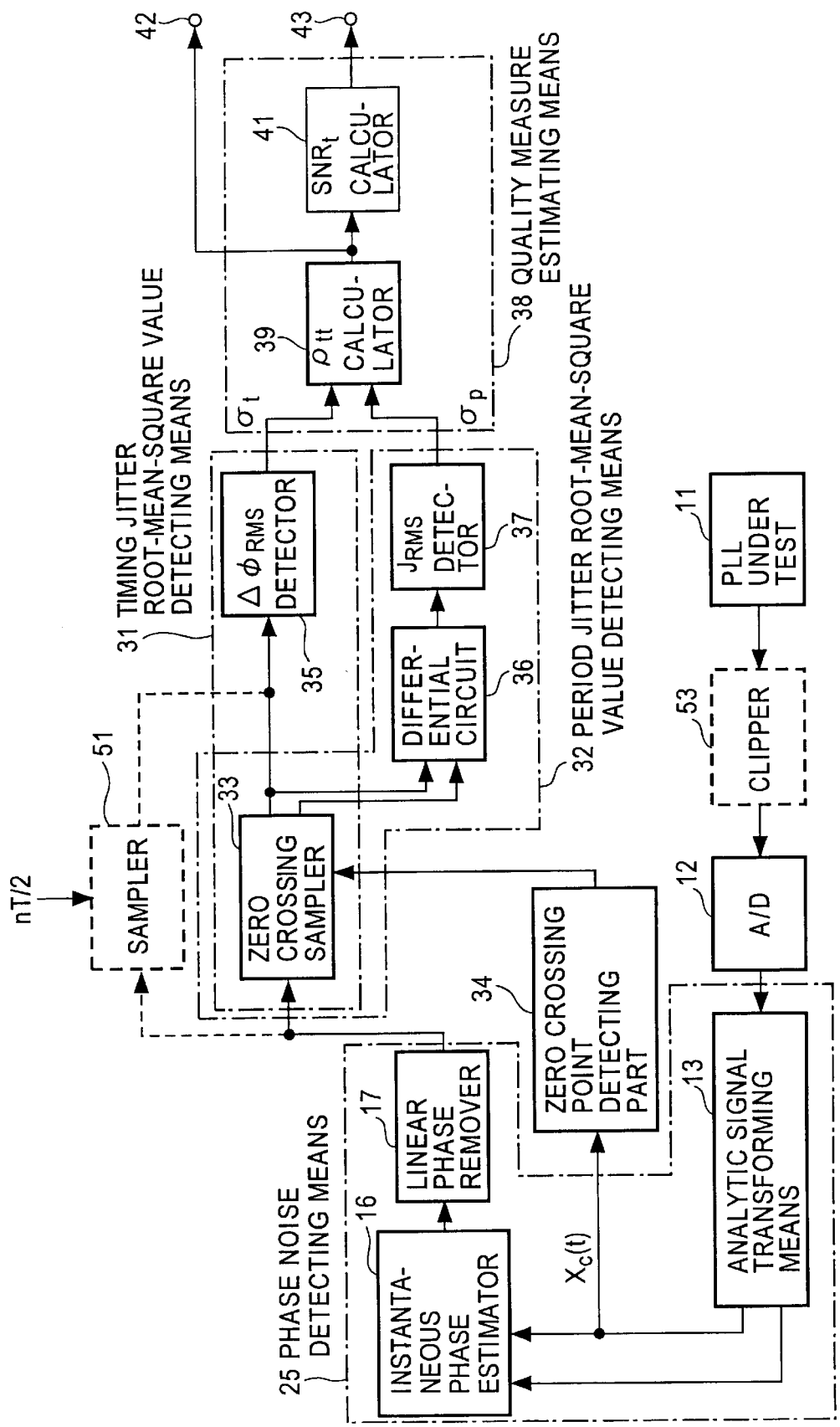
FIG. 3 is a block diagram showing a functional configuration of an embodiment of an apparatus for measuring a quality measure according to the present invention.

FIG. 3 shows an embodiment of the present invention. Portions in FIG. 3 corresponding to those in FIG. 2 have the same reference numerals affixed thereto as those in FIG. 2. In the present invention, similarly to the case shown in FIG. 2, an input signal from a PLL circuit under test 11 or the like is converted into a digital signal by an AD converter 12. This digital signal is inputted to phase noise detecting means 25, by which a phase noise waveform Δφ(t) is extracted therefrom. This phase noise waveform Δφ(t) is supplied to timing jitter root-mean-square value detecting means 31 and period jitter root-mean-square value detecting means 32. In the timing jitter root-mean-square value detecting means 31, a root-mean-square value $Δφ_{RMS}$ of the inputted phase noise waveform Δφ(t) is calculated. In the period jitter root-mean-square value detecting means 32, a root-mean-square value $J_{RMS}$ of the period jitters $J_p$ is calculated from the inputted phase noise waveform Δφ(t).

In the timing jitter root-mean-square value detecting means 31 and the period jitter root-mean-square value detecting means 32, in this example, the phase noise waveform Δφ(t) is sampled by a zero crossing sampler 33 at a timing closest to a zero crossing point of a real part $x_c(t)$ of an analytic signal $z_c(t)$.

Figure 4A:
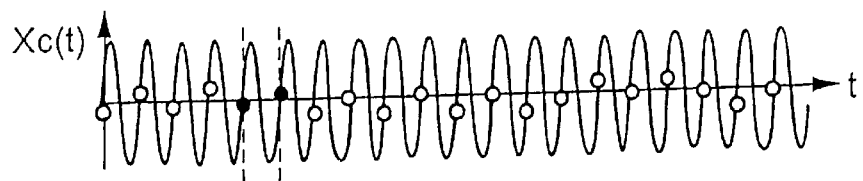
FIG. 4 is a diagram showing a relationship among zero crossing points of a real part $x_c(t)$, a phase noise waveform and period jitters of an input signal.
Figure 4B:
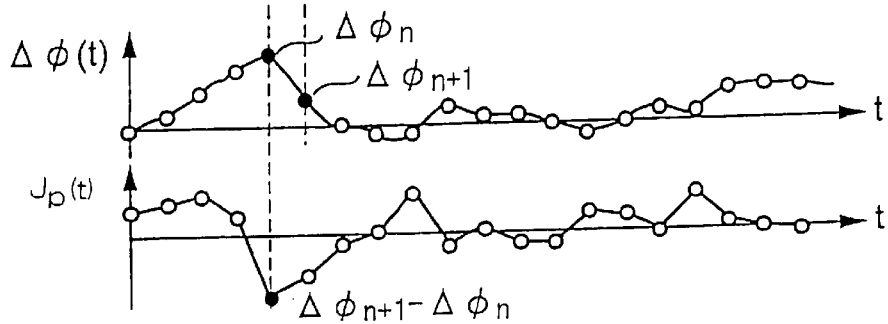
Figure 4C:
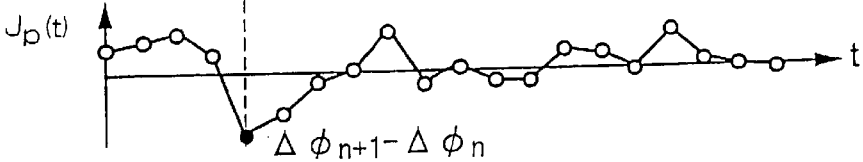

That is, a waveform of a real part $x_c(t)$ of an analytic signal is shown in FIG. 4A, and a sampling point (arithmetic processing point) closest to a zero crossing point of the rising (or falling) edge of the waveform is detected by a zero crossing point detecting part 34. In FIG. 4A, a point closest to the detected zero crossing point is indicated by a mark ○. This point is called an approximate zero crossing point. As shown in FIG. 4B, a value of the phase noise waveform Δφ(t) indicated by a mark ○ is extracted by a zero crossing sampler 33 as a sample value at the approximate zero crossing point. Each of the extracted sample values (re-sampled phase noise waveform) is a deviated quantity from an ideal timing (zero crossing point) of a real part $x_c(t)$ of a jitter-free analytic signal. Regarding the sample values of the Δφ(t), when a difference between each sample value and its immediately previous sample value is obtained, this difference is a fluctuation between zero crossings, i.e., a period jitter $J_p$. A period jitter $J_p$ can be obtained from nth sample value $Δφ_n$ and (n+1)th sample $Δφ_{n+1}$ of the Δφ(t) in FIG. 4B as $J_pΔφ_{n+1}-Δφ_n$. The $J_p$ thus obtained is shown in FIG. 4C.

A detecting method of an approximate zero crossing point in the zero crossing point detecting part 34 will be explained. The maximum value of a waveform of an inputted real part $x_c(t)$ is defined as 100% level, and the minimum value is defined as 0% level to calculate 50% level V (50%) of the difference between the 100% level and the 0% level as a zero crossing level. A difference between a sample value and 50% level V (50%) and a difference between its adjacent sample value and 50% level V (50%), i.e., $(x_c(j-1)-V(50\%))$ and $(x_c(j)-V(50\%))$ are calculated, and further a product of those difference values $(x_c(j-1)-V(50\%))\times(x_c(j)-V(50\%))$ is calculated. When the $x_c(t)$ crosses 50% level, i.e., zero level, the sign of its sample value $x_c(j-1)$ or $x_c(j)$ changes from a negative sign to a positive sign or from a positive sign to a negative sign. Therefore, when the product is negative, it is detected that the $x_c(t)$ has passed the zero level, and a time point j–1 or j at which a smaller absolute value of the sample value $x_c(j-1)$ or $x_c(j)$ is detected is obtained as an approximate zero crossing point.

The re-sampled phase noise waveform from the zero crossing sampler 33 is inputted to a $Δφ_{MRS}$ (root-mean-square value) detector 35, where its root-mean-square value is calculated by the following equation to obtain a timing jitter root-mean-square value $Δφ_{RMS}$, i.e., $\sigma_t$.

$$Δφ_{RMS} = \sigma_t = \sqrt{\frac{1}{N}\sum_{n=0}^{N-1} Δφ^2(nT)}$$

In addition, in the period jitter root-mean-square value detecting means 32, regarding the sample values from the zero crossing sampler 33, a difference between each sample value and its immediately previous sample value is obtained by the differential circuit 36 in the sequential order to obtain a period jitter $J_p$. Regarding a series of obtained period jitters $J_p$, a root-mean-square value is calculated by a $J_{RMS}$ (root-mean-square value) detector 37. That is, a differential waveform of a re-sampled phase noise waveform from the zero crossing sampler 33 is calculated by the differential circuit 36, and the differential phase noise waveform is supplied to the root-mean-square value detector 37, where the following equation is calculated.

$$J_{RMS} = \sigma_p = \sqrt{\frac{1}{N}\sum_{n=0}^{N-1} J_p^2(n)}$$

In this manner, a period jitter root-mean-square value $J_{RMS}$, i.e., a period jitter variance $\sigma_p$ can be obtained.

The timing jitter root-mean-square value $\Delta\phi_{RMS}$ (timing jitter variance $\sigma_t$) and the period jitter root-mean-square value $J_{RMS}$ (period jitter variance $\sigma_p$) obtained as mentioned above are inputted to quality measure estimating means 38. In the quality measure estimating means 38, the equation (2) is calculated by correlation coefficient ($\rho_{tt}$) calculator 39 based on the $\sigma_t$ and the $\sigma_p$ to obtain a correlation coefficient $\rho_{tt}$. In this example, this correlation coefficient $\rho_{tt}$ is inputted to a signal to noise ratio ($SNR_t$) calculator 41, by which the equation (7) is calculated based on this $\rho_{tt}$ to obtain the $SNR_t$. The correlation coefficient $\rho_{tt}$ and/or the signal to noise ratio $SNR_t$ are outputted from an output terminals 42 and/or an output terminal 43 as quality measures, respectively.

Figure 5:
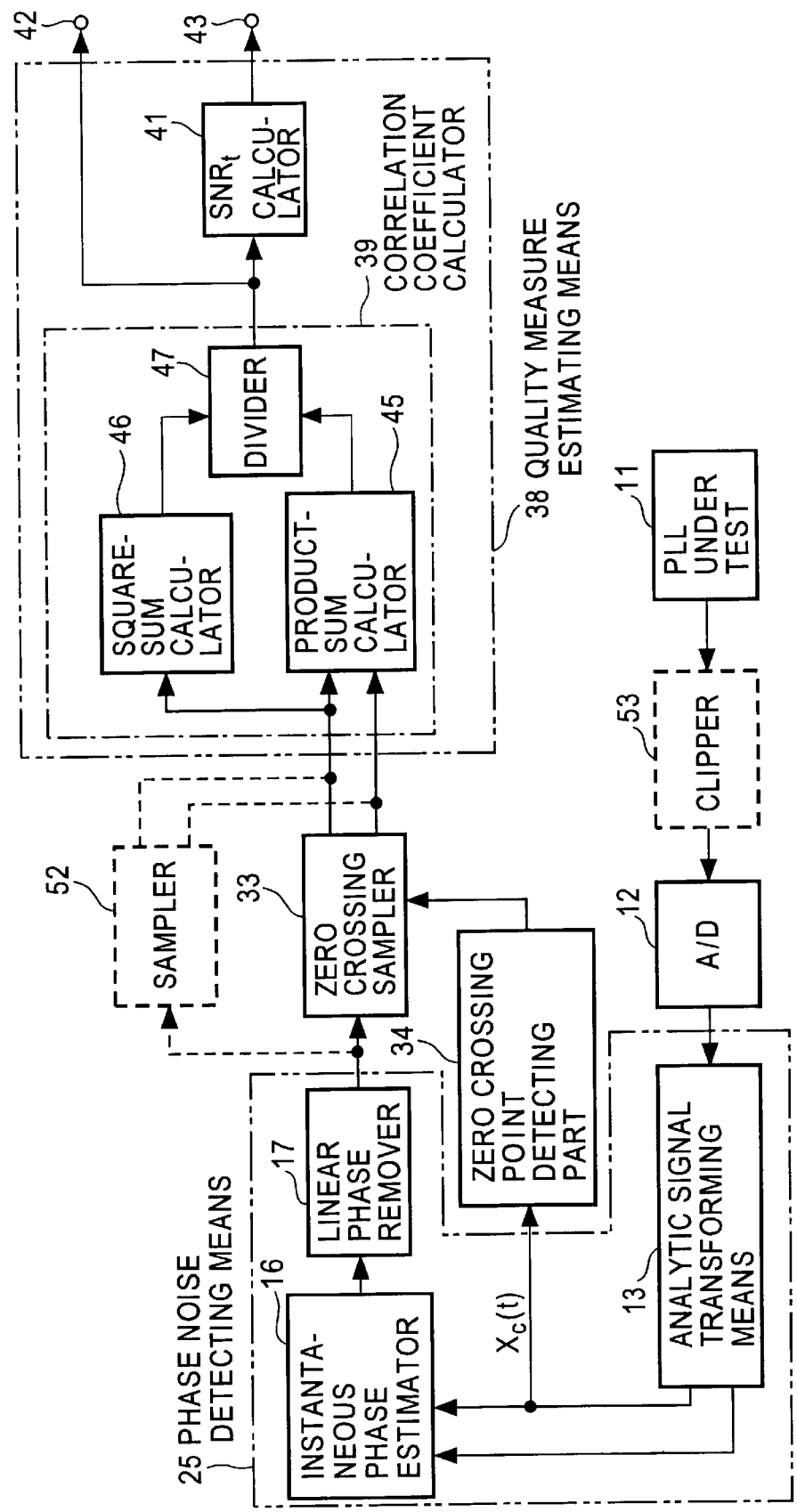
FIG. 5 is a block diagram showing a functional configuration of another embodiment of the present invention.

FIG. 5 shows another embodiment of the present invention. Portions in FIG. 5 corresponding to those in FIG. 3 have the same reference numerals affixed thereto as those in FIG. 3. In this embodiment, the equation (3) from which the $\Delta\phi'$ is omitted is calculated by the correlation coefficient ($\rho_{tt}$) calculator 39 with respect to the re-sampled phase noise waveform from the zero crossing sampler 33. That is, two series of re-sampled phase noise waveforms having a time difference of period T between them are inputted to a product-sum calculator 45, by which a product-sum between the $\Delta\phi(iT)$ and the $\Delta\phi((i+1)T)$ is calculated. In addition, one series of the re-sampled phase noise waveforms from the zero crossing sampler 33 is inputted to a square-sum calculator 46, by which a sum of $\Delta\phi(iT)^2$ is calculated. The product-sum $\Sigma\Delta\phi(iT)\Delta\phi((i+1)T)$ calculated by the product-sum calculator 45 is divided by the calculated square-sum $\Sigma\Delta\phi(iT)^2$ in a divider 47 to obtain a correlation coefficient $\rho_{tt}$. This correlation coefficient $\rho_{tt}$ is outputted, if necessary, from the output terminal 42. In addition, this correlation coefficient $\rho_{tt}$ is inputted to the signal to noise ratio calculator 41, by which a calculation of the equation (7) is performed, and the calculated result $SNR_t$ is outputted to an output terminal 43.

In the embodiment shown in FIG. 3, the phase noise waveform is sampled by the zero crossing sampler 33 at a timing close to a zero crossing point of a rising edge. However, in general, the phase noise waveform may be sampled by the zero crossing sampler 33 at an interval of integer multiple of a time duration between a zero crossing point of a rising edge and a zero crossing point of a falling edge, and at a timing close to a zero crossing point. In addition, the re-sampled phase noise waveform to be supplied to the $\Delta\phi_{RMS}$ detector 35 may be an output of the zero crossing sampler 33, or a sampler 51 may be separately provided as indicated by a dashed line and the phase noise waveform may be sampled by the sampler 51 the timing of the same period as the period nT/2 (n is an integer) of the re-sampled phase noise waveform to be supplied to the differential circuit 36 to supply the sampled phase noise waveform to the $\Delta\phi_{RMS}$ detector 35. Regarding a sampling timing in this case, since the period T of the input signal is known, the phase noise waveform may be sampled at an interval of integer multiple of the sampling period t of the AD converter 12, and at a timing closest to nT/2.

In addition, since $\sigma_p^2$ and $\sigma_t^2$ are involved in the calculation of the equation (2), calculation results before extraction of the square root in the $\Delta\phi_{RMS}$ detector 35 and $J_{RMS}$ detector 37, respectively may be supplied to a correlation coefficient calculator 39.

Also in the embodiment of FIG. 5, the sampling timing of the zero crossing sampler 33 may be close to nT/2. In addition, as indicated by a dotted line, a sampler 52 may be provided instead of the zero crossing sampler 33 to set a sampling period T', and the phase noise waveform may be sampled at a timing close to each arbitrary period T'. Alternatively, without providing the sampler 33 or 52, the phase noise waveform $\Delta\phi(t)$ from the phase noise waveform detecting means 25 may be directly supplied to the correlation coefficient calculator 39. In the calculation of the correlation coefficient calculator 39, the $\Delta\phi'$, i.e., an average value of the inputted phase noise waveform may be calculated to perform the faithful calculations of the equations (3) and (4).

As indicated by a dashed line in FIG. 3, a clock signal from the PLL circuit under test 11 may be supplied to the AD converter 12 via a clipper 53 so that the amplitude of the clock signal is made constant, whereby the phase noise waveform $\Delta\phi(t)$ is not influenced by an amplitude modulation component, and hence a jitter can correctly be measured. This processing facility for making the amplitude of an input signal constant may be provided in output side of the AD converter 12.

Figure 6:
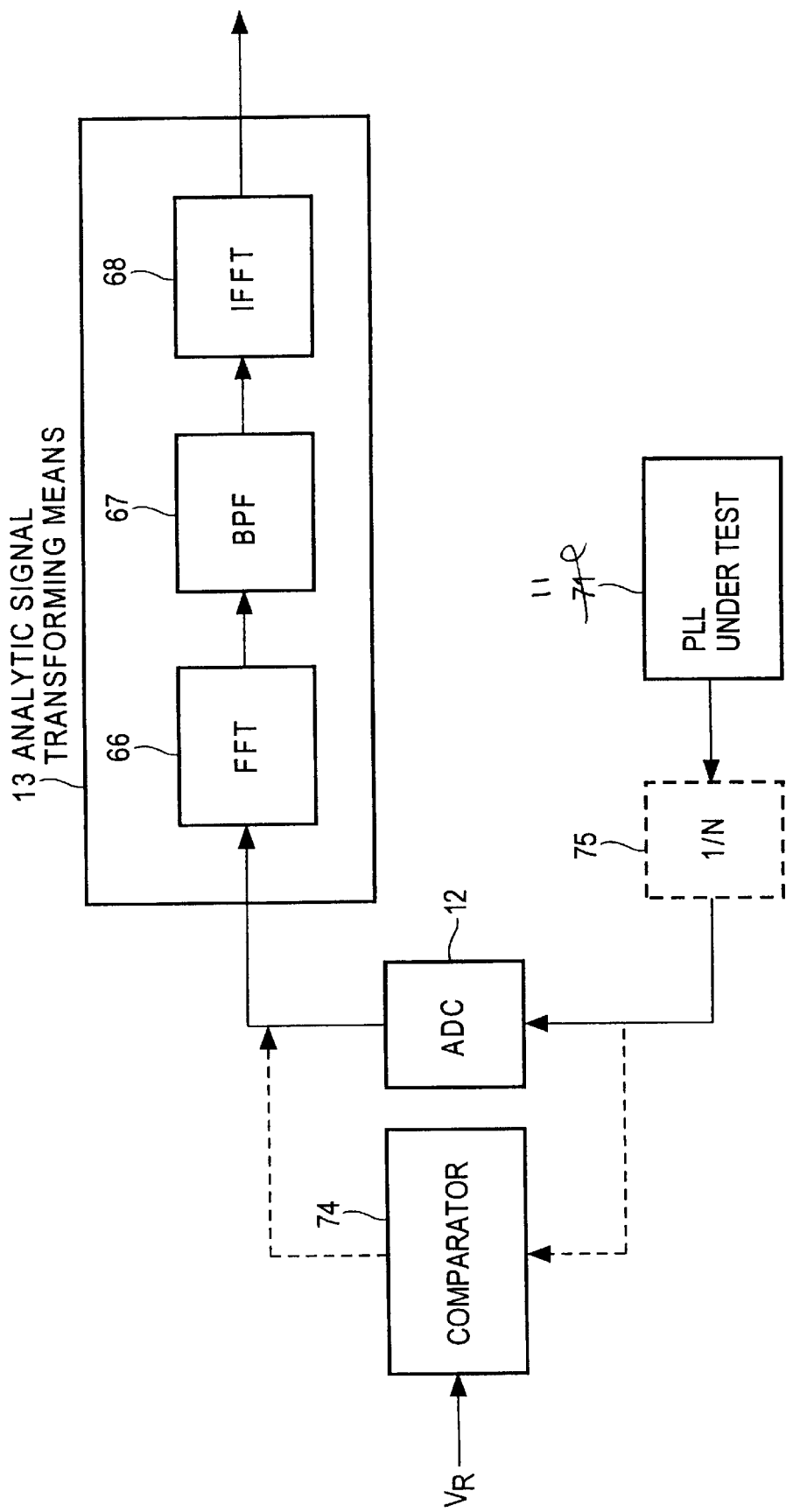
FIG. 6 is a block diagram showing a modified example of analytic signal transforming means 13.

In the means 13 for transforming an input signal into an analytic signal $z_c(t)$, as shown in FIG. 6, an inputted digital signal is Fourier-transformed by an FFT part 66, and negative frequency components are cut off from the transformed output by a bandpass filter 67 to extract a fundamental wave only of the input clock signal. Then the output of the bandpass filter 67 is inverse-Fourier-transformed by an inverse FFT part 68 to obtain an analytic signal $z_c(t)$.

Figure 7:
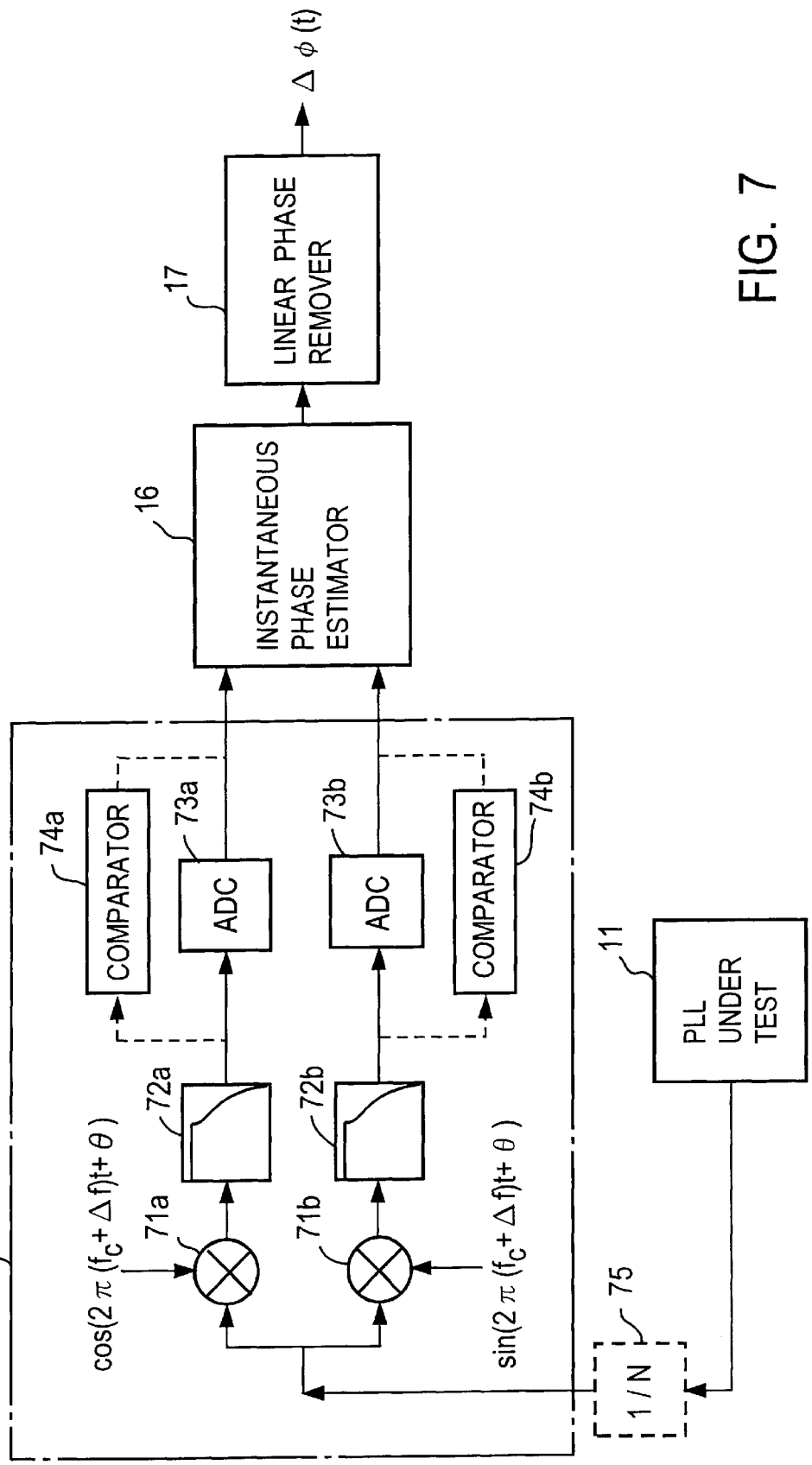
FIG. 7 is a block diagram showing another modified example of the analytic signal transforming means 13.

Alternatively, as shown in FIG. 7, an input clock signal $x_c(t)$ is mixed with $\cos(2\pi(f_c+\Delta f)t+\theta)$ and $\sin(2\pi(f_c+\Delta f)t+\theta)$ in frequency mixers 71a and 71b, respectively. Then difference frequency components are extracted from the outputs of the low pass filters 72a and 72b, respectively to obtain an analytic signal $z_c(t)$ expressed by the following equation.

$$z_c(t) = (A_c/2)[\cos(2\pi\Delta ft + (\theta - \theta_c) - \Delta\phi(t)) + j\sin(2\pi\Delta ft + (\theta - \theta_c) - \Delta\phi(t))]$$

A real part and an imaginary part of the above equation are converted into digital signals by AD converters 73a and 73b respectively, and those digital signals are supplied to an instantaneous phase estimator 16.

In the aforementioned configuration, a comparator may be used instead of the AD converter. That is, as indicated by a dashed line in FIG. 6 for example, a comparator 74 may be used to convert the input signal to a signal representing that the input signal is equal to or greater than a reference level or the input signal is smaller than the reference level, namely to one bit digital signal. In addition, as indicated by dashed lines in FIG. 7, comparators 74a and 74b may be used instead of the AD converters 73a and 73b, respectively.

In order to supply a clock signal with its decreased frequency to the analytic signal transforming means 13, as indicated by dashed lines in FIGS. 6 and 7, the clock signal frequency may be frequency-divided by a frequency divider 75 to supply the frequency-divided clock signal to the analytic signal transforming means 13. Alternatively, although not illustrated, the clock signal may be converted, using substantially jitter-free local signal, into a difference frequency signal between those signals by a frequency converter to supply the difference frequency signal to the analytic signal transforming means 13. One or more functions of each functional configuration of the apparatus shown in FIGS. 3, 5, 6 and 7 may also be performed by decoding and executing programs in a computer.

In the aforementioned description, there has been explained, as a signal under test, a case of clock signal of a microprocessor. However, the present invention can be applied to an estimation of a quality measure such as a correlation coefficient, a signal to noise ratio, or the like of a phase noise waveform of a clock signal or another signal such as a sine wave signal or the like used in other devices.

A relationship between a period jitter variance $\sigma_p^2$ of a clock signal and an $SNR_t$ of the $\{\Delta\phi(nT)\}$ has been verified by an experiment. In the experiment, a microprocessor was used. Its internal PLL circuit can generate a clock signal having a frequency of 200 NHz–600 MHz. The clock quality was estimated by placing the PLL circuit under two extreme conditions. One of the extreme conditions is quiet mode, i.e., a case of non-active state of a microprocessor. In the non-active state, when the personal computer waits for a user instruction, only a PLL circuit outputting a clock signal by giving thereto a phase base based on a reference clock from a reference clock generator operates, wherein the best state that the clock is not influenced by the operation of the personal computer is provided. The other extreme condition is noisy mode, i.e., a case of extremely active state of a microprocessor. In the noisy mode, a level 2 memory, a core bus and branch predictor units in a personal computer are all in full operation, wherein toggle operation of the microprocessor is maximized by those operations and a test program. That is, a state that the clock is most influenced by the operation of the personal computer is provided.

Figures 8, 9:
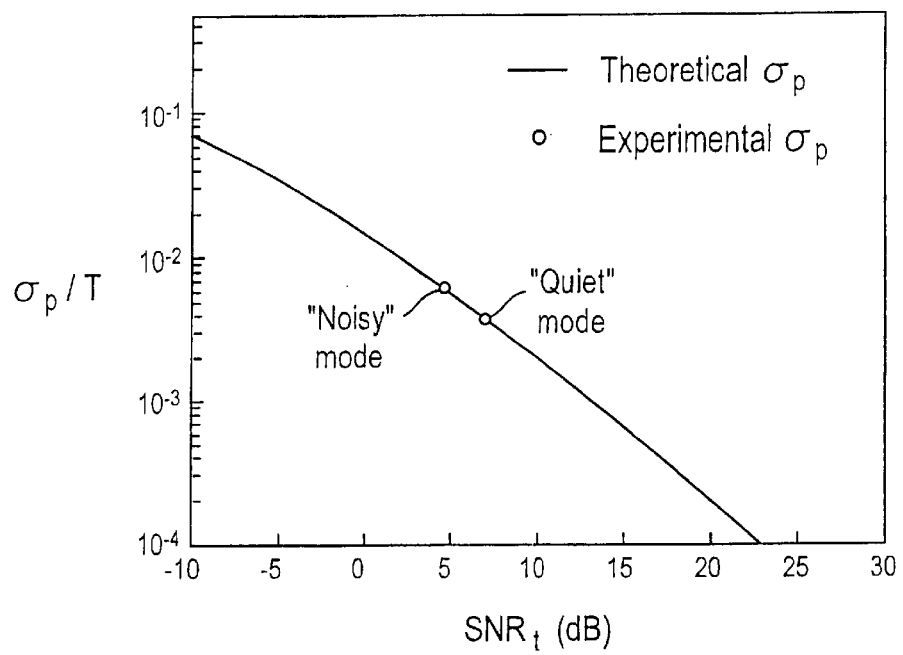
FIG. 8 is a graph showing experimental results.
FIG. 9 is a diagram showing their numeric values.

FIG. 8 shows a relationship between a correlation coefficient $|\rho_{tt}(T)|$ obtained from the equation (2) or (3) and an $SNR_t$ obtained from the equation (7). The axis of abscissas represents the $SNR_t$ and the axis of ordinates axis represents the $\sigma_p/T$. The solid line indicates theoretical values obtained from the equation (8), and a mark ○ indicates a experimental value. It can be seen that the experimental value is present on the theoretical curve, and hence the experimental value coincides with the theoretical value. FIG. 9 shows measured values in this case.

As mentioned above, according to the present invention, a correlation coefficient $\rho_{tt}$ and a noise to ratio $SNR_t$ between zero crossing points of an input signal can be obtained. In the design and the trial manufacturing, $\rho_{tt}=1$ gives an upper limit of the $SNR_t$. Therefore, it is possible to ascertain, by a simulation at the design time or by measuring the $\rho_{tt}$ or the $SNR_t$ of an article made on an experimental basis, as to how much the clock quality can be improved more. When a $\rho_{tt}$ is measured by individually operating each of core blocks to be packaged with a PLL circuit, and when the measured result indicates a small $\rho_{tt}$ value, it can be considered that the PLL circuit receives relatively large influence from the noise or the like generated by the core block. Therefore, it can be seen that there is a necessity to provide a shield or the like between the core block and the PLL circuit so that the PLL circuit is not influenced from the core block.

Moreover, since the $\Delta\phi$ method is used in the present invention, ($\sigma p$, $\sigma_t$) and quality measures ($SNR_t$, $\rho_{tt}$) can be measured at the same time as test items in the test of a microprocessor or the like.

In addition, in the case of obtaining a $\rho_{tt}$ from the equation (3) or (4), it is sufficient to use a timing jitter $\Delta\phi(t)$ only. An occurrence of a timing jitter is based on its probability, and in general, the positive side maximum fluctuation value $\Delta\phi_{max}^+$ from an ideal timing is equal to the negative side maximum fluctuation value $\Delta\phi_{max}^-$ from the ideal timing. Therefore, the case of obtaining a correlation coefficient $\rho_{tt}$ from the equation (3) or (4) requires shorter time than the case of obtaining a correlation coefficient $\rho_{tt}$ from the equation (2) that uses a period jitter variance $\sigma_p$. Moreover, in the case of obtaining a $\rho_{tt}$ from a computer simulation, the calculation in the equation (3) is simpler and more convenient than the case of the equation (2). Further, the equation (2) can obtain a $\rho_{tt}$ in higher accuracy than the equation (3) can.

What is claimed is:

1. An apparatus for obtaining a quality measure of a continuous-time input signal having a clock waveform, the apparatus comprising:
   bandpass analytic signal transforming means for transforming the input signal into a bandpass-filtered complex analytic signal;
   instantaneous phase estimating means for obtaining an instantaneous phase of the analytic signal;
   linear phase removing means for obtaining a linear phase from the instantaneous phase and removing the linear phase from the instantaneous phase to obtain a phase noise waveform; and
   quality measure estimating means for deriving the quality measure of the input signal by obtaining a correlation coefficient between zero crossings of the phase noise waveform.

2. The apparatus according to claim 1 wherein said quality measure estimating means is also for deriving another quality measure of the input signal by obtaining a signal-to-noise ratio of fluctuation between zero crossings of the phase noise waveform.

3. The apparatus according to claim 1 that comprises:
   timing jitter mean-square value detecting means for obtaining a timing jitter mean-square value of the phase noise waveform; and
   period jitter mean-square value detecting means for obtaining a period jitter mean-square value of the phase noise waveform;
   wherein said correlation coefficient means uses the timing jitter mean-square value and the period jitter mean-square value to obtain the correlation coefficient.

4. The apparatus according to claim 3, wherein said period jitter mean-square value detecting means comprises:
   zero crossing sampling means for sampling the phase noise waveform at timings that are separated by integer multiples of a sampling period and are closest to zero crossings of a real part of the analytic signal to output a re-sampled phase noise waveform;
   differential means for calculating a difference between adjacent samples of the re-sampled phase noise waveform to obtain a series of period jitters; and mean-square means for calculating a mean-square value of the series of period jitters to obtain the period jitter mean-square value.

5. The apparatus according to claim 4, wherein said timing jitter mean-square value detecting means comprises:
means for calculating a mean-square value of samples in the re-sampled phase noise waveform to obtain the timing jitter mean-square value.

6. The apparatus according to claim 4, wherein said timing jitter mean-square value detecting means comprises:
second sampling means for sampling the phase noise waveform at timings that are separated by integer multiples of the sampling period of said zero crossing sampling means and are closest to zero crossings of the real part of the analytic signal to output a second re-sampled phase noise waveform; and
means for calculating a mean-square value of samples in the second re-sampled phase noise waveform to obtain the timing jitter mean-square value.

7. The apparatus according to claim 1 that comprises:
zero crossing sampling means for sampling the phase noise waveform at timings that are separated by integer multiples of a sampling period and are closest to zero crossings of a real part of the analytic signal to output two series of samples in re-sampled phase noise waveforms having a time difference therebetween of a period T of the input signal;
and wherein said correlation coefficient means comprises:
product-sum means for summing a product of samples from the two series of samples in the re-sampled phase noise waveforms each being spaced apart from one another by an integer multiple of the sampling period;
square-sum means for summing a square value of samples in the re-sampled phase noise waveform; and
means for dividing a sum of products obtained from the product-sum means by a sum of squares obtained from the square-sum means to obtain the correlation coefficient.

8. The apparatus according to claim 7, wherein said integer multiple of the sampling period is equal to an integer multiple of ½ of the period of the input signal.

9. An apparatus for obtaining a quality measure of a continuous-time input signal having a clock waveform, the apparatus comprising:
bandpass analytic signal transforming means for transforming the input signal into a bandpass-filtered complex analytic signal;
instantaneous phase estimating means for obtaining an instantaneous phase of the analytic signal;
linear phase removing means for obtaining a linear phase from the instantaneous phase and removing the linear phase from the instantaneous phase to obtain a phase noise wave form; and
means for deriving the quality measure of the input signal by obtaining a signal-to-noise ratio of fluctuation between zero crossings of the phase noise waveform.

10. The apparatus according to claim 9, wherein said means for obtaining the signal-to-noise ratio of fluctuation between zero crossings of the phase noise waveform uses a correlation coefficient between zero crossings of the phase noise waveform.

11. The apparatus according to claim 1 comprising:
timing jitter mean-square value detecting means for obtaining a timing jitter mean-square value of the phase noise waveform; and
period jitter mean-square value detecting means for obtaining a period jitter mean-square value of the phase noise waveform;
wherein said quality measure estimating means comprises:
means for obtaining the correlation coefficient between zero crossings of the phase noise waveform by using the timing jitter mean-square value and the period jitter mean-square value; and
means for obtaining a signal-to-noise ratio of fluctuation between zero crossings of the phase noise waveform to derive another quality measure of the input signal by using the correlation coefficient.

12. The apparatus according to claim 11, wherein said period jitter mean-square value detecting means comprises:
zero crossing sampling means for sampling the phase noise waveform at timings that are separated by integer multiples of a sampling period and are closest to zero crossings of a real part of the analytic signal to output a re-sampled phase noise waveform;
differential means for calculating a difference between adjacent samples of the re-sampled phase noise waveform to obtain a series of period jitters; and
mean-square means for calculating a mean-square value of the series of period jitters to obtain the period jitter mean-square value.

13. The apparatus according to claim 12, wherein said timing jitter mean-square value detecting means comprises:
means for calculating a mean-square value of samples in the re-sampled phase noise waveform to obtain the timing jitter mean-square value.

14. The apparatus according to claim 12, wherein said timing jitter mean-square value detecting means comprises:
second sampling means for sampling the phase noise waveform at timings that are separated by integer multiples of the sampling period of said zero crossing sampling means and are closest to zero crossings of the real part of the analytic signal to output a second re-sampled phase noise waveform; and
means for calculating a mean-square value of samples in the second re-sampled phase noise waveform to obtain the timing jitter mean-square value.

15. The apparatus according to claim 9 that comprises:
zero crossing sampling means for sampling the phase noise waveform at timings that are separated by integer multiples of a sampling period and are closest to zero crossings of a real part of the analytic signal to output two series of samples in re-sampled phase noise waveforms having a time difference therebetween of a period T of the input signal;
wherein said correlation coefficient means comprises:
product-sum means for summing a product of samples from the two series of samples in the re-sampled phase noise waveforms each being spaced apart from one another by an integer multiple of the sampling period;
square-sum means for summing a square value of samples in the re-sampled phase noise waveforms; and
means for dividing a sum of products obtained from the product-sum means by a sum of squares obtained from the square-sum means to obtain the correlation coefficient.

16. The apparatus according to any one of claims 1, 2, 3, 9 and 11, further comprising means for supplying the input signal, after removing therefrom an amplitude modulation component, to the analytic signal transforming means.

17. A method for obtaining a quality measure of a continuous-time input signal having a clock waveform, the method comprising the steps of:

transforming the input signal into a bandpass-filtered complex analytic signal;

obtaining an instantaneous phase of the analytic signal;

obtaining a linear phase from the instantaneous phase;

removing the linear phase from the instantaneous phase to obtain a phase noise waveform; and deriving the quality measure of the input signal by obtaining a correlation coefficient between zero crossings of the phase noise waveform.

18. The method according to claim 17, that comprises:

sampling the phase noise waveform at timings that are separated by integer multiples of a sampling period and are closest to zero crossings of a real part of the analytic signal to output two series of samples in re-sampled phase noise waveforms having a time difference therebetween of a period T of the input signal;

and wherein said correlation coefficient is obtained by:

calculating a product-sum by summing a product of samples from the two series of samples in the re-sampled phase noise waveforms each being spaced apart from one another by an integer multiple of the sampling period;

calculating a square-sum by summing a square value of samples in the re-sampled phase noise waveforms; and dividing the product-sum by the square-sum to obtain the correlation coefficient.

19. The method according to claim 17 that comprises:

deriving another quality measure of the input signal by obtaining a signal-to-noise ratio of fluctuation between zero crossings of the phase noise waveform.

20. A method for obtaining a quality measure of a continuous-time input signal comprising the steps of:

transforming the input signal into a complex analytic signal;

obtaining an instantaneous phase of the analytic signal;

removing a linear phase from the instantaneous phase to obtain a phase noise waveform; and estimating a quality measure of the phase noise waveform to obtain the quality measure of the input signal by:

obtaining a mean-square value of samples of the phase noise waveform;

obtaining a mean-square value of period jitters of the phase noise waveform; and calculating a correlation coefficient of the phase noise waveform as the quality measure of the input signal from the mean-square value of the samples of the phase noise waveform and the mean-square value of period jitters.

21. The apparatus according to claim 1, wherein said linear phase removing means comprises:

means for converting the instantaneous phase into a continuous phase; and means for estimating the linear phase from the continuous phase.

22. The apparatus according to claim 1, wherein said bandpass analytic signal transforming means comprises:

means for applying a Fourier transform to the input signal to obtain a Fourier-transformed signal;

bandpass filter means for applying a bandpass filter to the Fourier-transformed signal to cut off negative frequency components and harmonics of the fundamental component of the input signal; and means for applying an inverse Fourier transform to an output of the bandpass filter means to derive the bandpass-filtered complex analytic signal.

23. The apparatus according to claim 22, wherein said bandpass filter means cuts off all harmonics of the fundamental component.

* * * * *